US 11,437,753 B2

(12) United States Patent
Wolfe et al.

(10) Patent No.: US 11,437,753 B2
(45) Date of Patent: Sep. 6, 2022

(54) HIGH DENSITY CONNECTOR

(71) Applicant: LEMO S.A., Ecublens (CH)

(72) Inventors: Charles Wolfe, Santa Rosa, CA (US);
Richard Glazier, Santa Rosa, CA (US);
Paul Matteri, Sebastopol, CA (US);
William H. Lee, Petaluma, CA (US)

(73) Assignee: LEMO S.A., Ecublens (CH)

( * ) Notice: Subject to any disclaimer, the term of this patent is extended or adjusted under 35 U.S.C. 154(b) by 0 days.

(21) Appl. No.: 17/054,749

(22) PCT Filed: May 16, 2019

(86) PCT No.: PCT/EP2019/062686
§ 371 (c)(1),
(2) Date: Nov. 11, 2020

(87) PCT Pub. No.: WO2019/219847
PCT Pub. Date: Nov. 21, 2019

(65) Prior Publication Data
US 2021/0226376 A1    Jul. 22, 2021

Related U.S. Application Data

(60) Provisional application No. 62/672,242, filed on May 16, 2018.

(30) Foreign Application Priority Data

May 16, 2018   (EP) .................................... 18172519

(51) Int. Cl.
*H01R 13/518*     (2006.01)
*H01R 12/73*      (2011.01)
(Continued)

(52) U.S. Cl.
CPC ......... *H01R 13/518* (2013.01); *H01R 12/732* (2013.01); *H01R 13/6273* (2013.01);
(Continued)

(58) Field of Classification Search
CPC ............ H01R 13/6586; H01R 13/6587; H01R 13/518; H01R 13/6273; H01R 12/73;
(Continued)

(56) References Cited

U.S. PATENT DOCUMENTS 5,997,361 A      12/1999   Driscoll
7,160,117 B2 *    1/2007   Ngo .................... H01R 13/514
                                                        439/76.1

(Continued)

FOREIGN PATENT DOCUMENTS

EP          0852414          7/1998

OTHER PUBLICATIONS

International Search Report and Written Opinion issued by the International Searching Authority, dated Sep. 18, 2019, for International Patent Application No. PCT/EP2019/062686; 17 pages.

*Primary Examiner* — Gary F Paumen
(74) *Attorney, Agent, or Firm* — Faegre Drinker Biddle & Reath LLP

(57) ABSTRACT

High density pluggable electrical connector having a number of electrical contacts exceeding sixty and a contact density on a plugging interface of the connector of at least forty contacts per square centimeter, comprising a casing and a terminal unit mounted within the casing, the terminal unit comprising a housing with a module receiving cavity formed within the housing, and a plurality of terminal modules insertably received in the module receiving cavity in a stacked arrangement. Each terminal module comprises a plurality of contacts mounted in a dielectric terminal (Continued)

module housing, the terminal modules having a width W to height H ratio W/H greater than three.

21 Claims, 13 Drawing Sheets

(51) Int. Cl.
*H01R 13/627* (2006.01)
*H01R 13/6586* (2011.01)
*H01R 27/02* (2006.01)
*H01R 13/6598* (2011.01)
*H05K 1/11* (2006.01)

(52) U.S. Cl.
CPC ......... *H01R 13/6586* (2013.01); *H01R 27/02* (2013.01); *H01R 13/6598* (2013.01); *H05K 1/117* (2013.01); *H05K 2201/09163* (2013.01); *H05K 2201/09409* (2013.01)

(58) Field of Classification Search
CPC .. H01R 12/732; H01R 27/02; H01R 13/6598; H05K 1/117; H05K 2201/09163; H05K 2201/09409
USPC ........................................ 439/607.06, 607.07
See application file for complete search history.

(56) References Cited

U.S. PATENT DOCUMENTS

| | | | |
|---|---|---|---|
| 9,748,697 B2* | 8/2017 | Patel | ................ H01R 13/6471 |
| 2006/0035531 A1 | 2/2006 | Ngo | |
| 2017/0018881 A1 | 1/2017 | Patel | |

\* cited by examiner

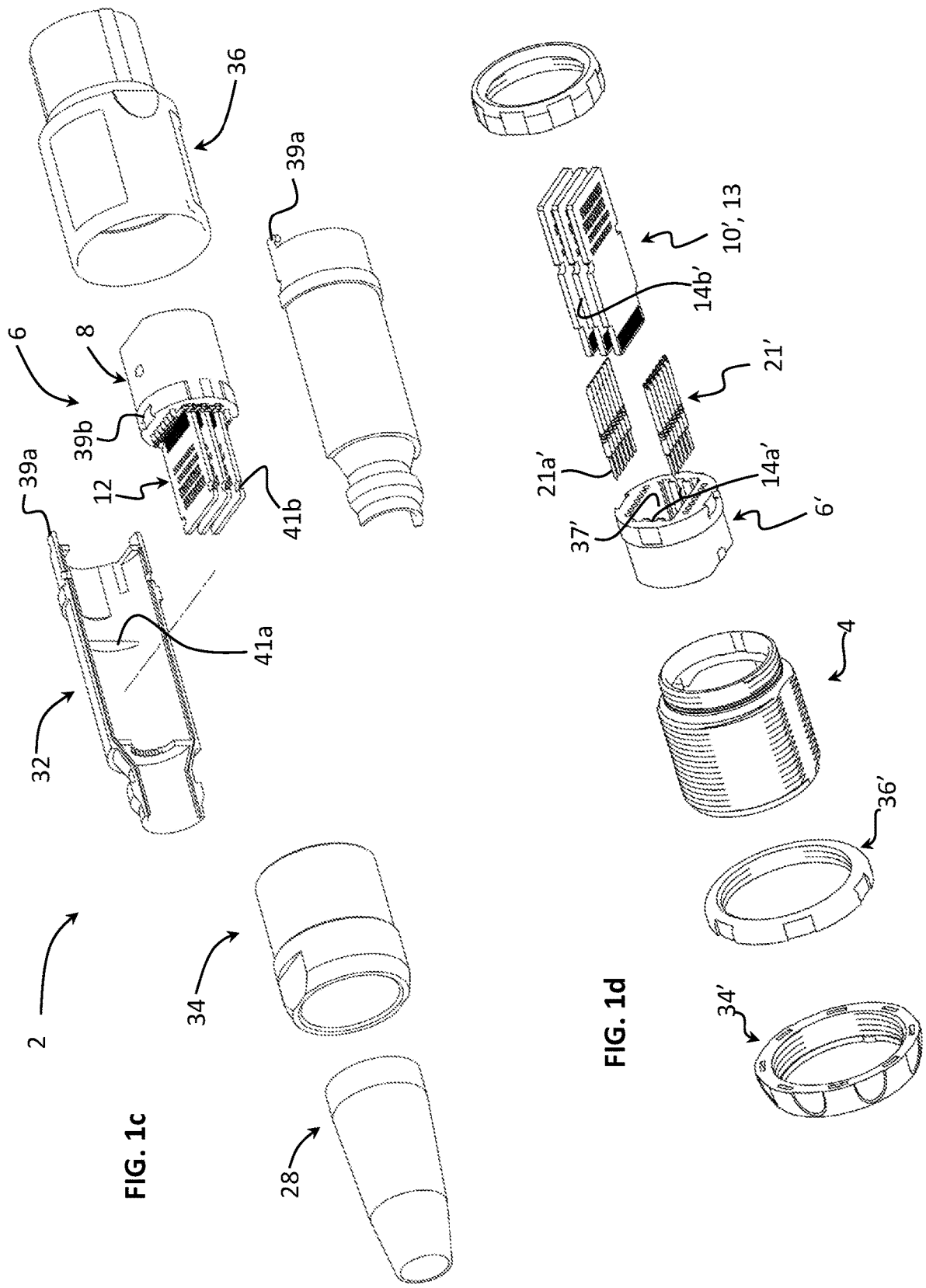

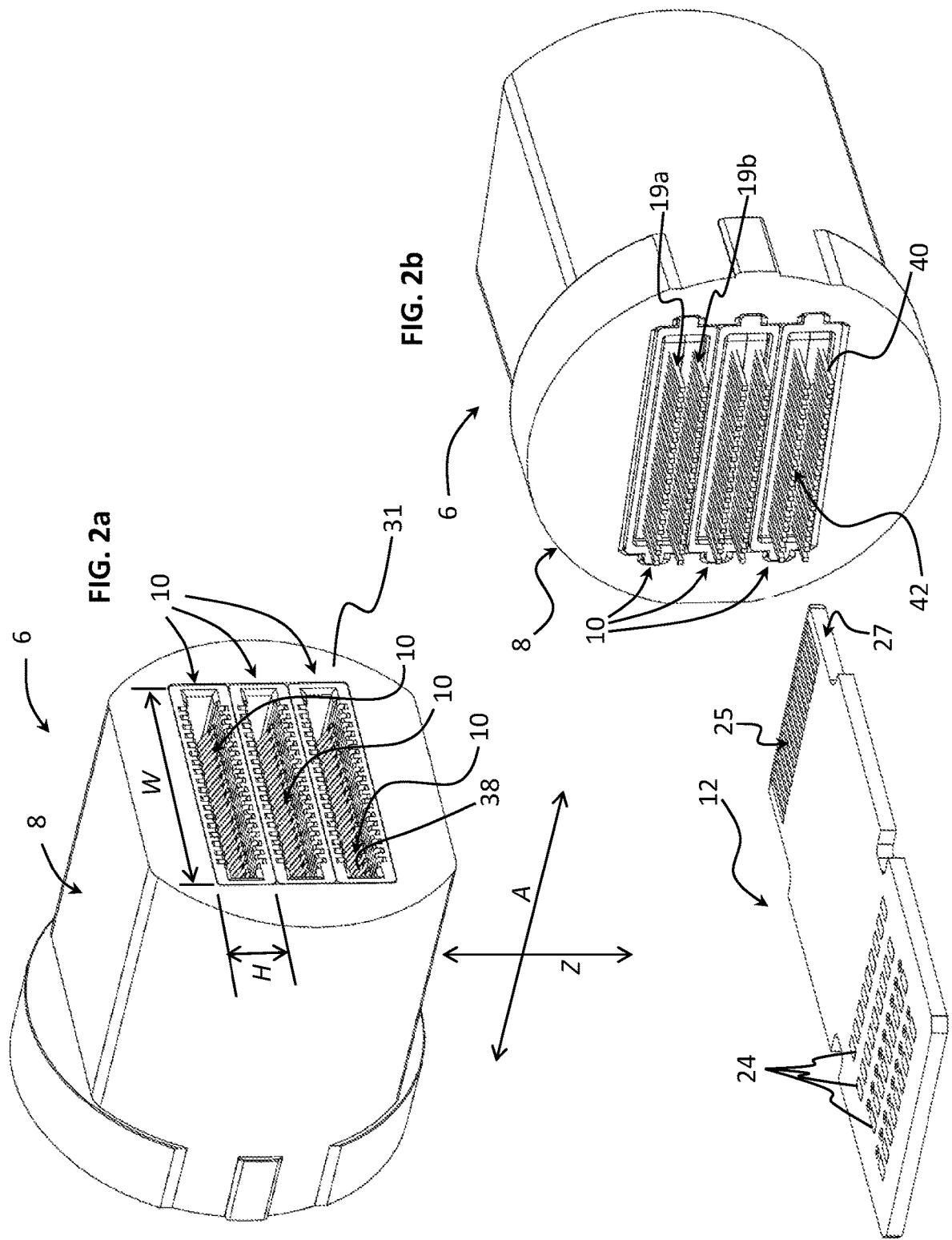

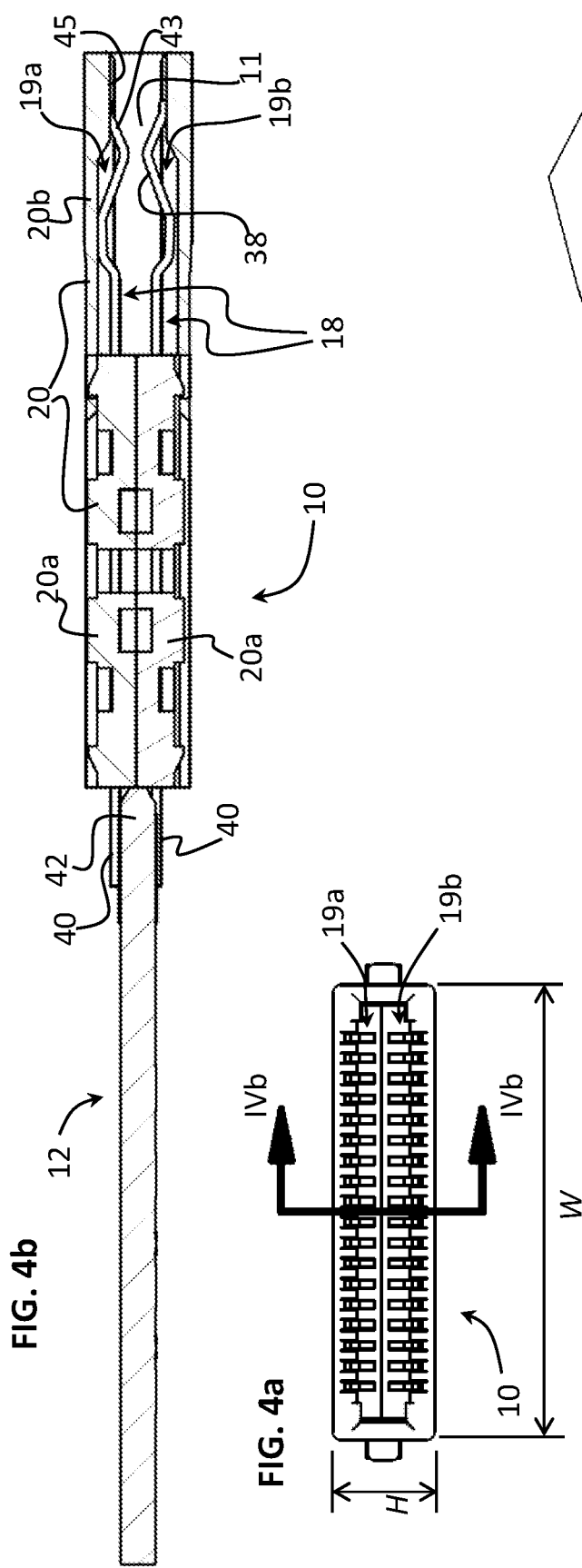
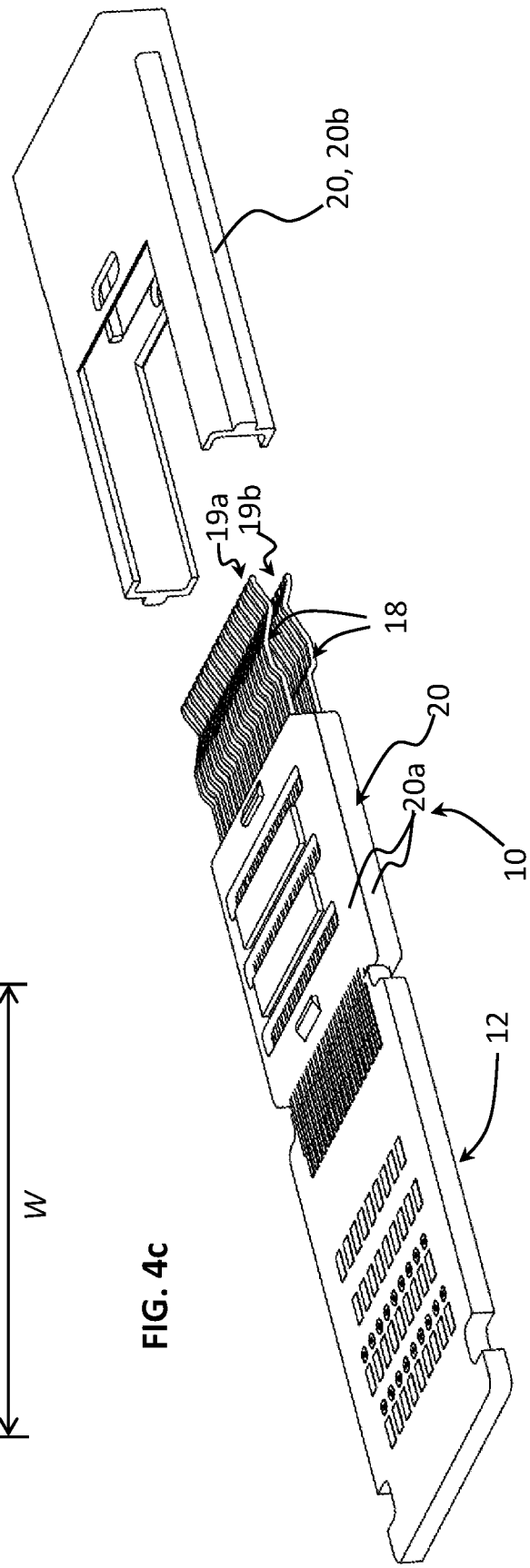
FIG. 4b
FIG. 4a
FIG. 4c

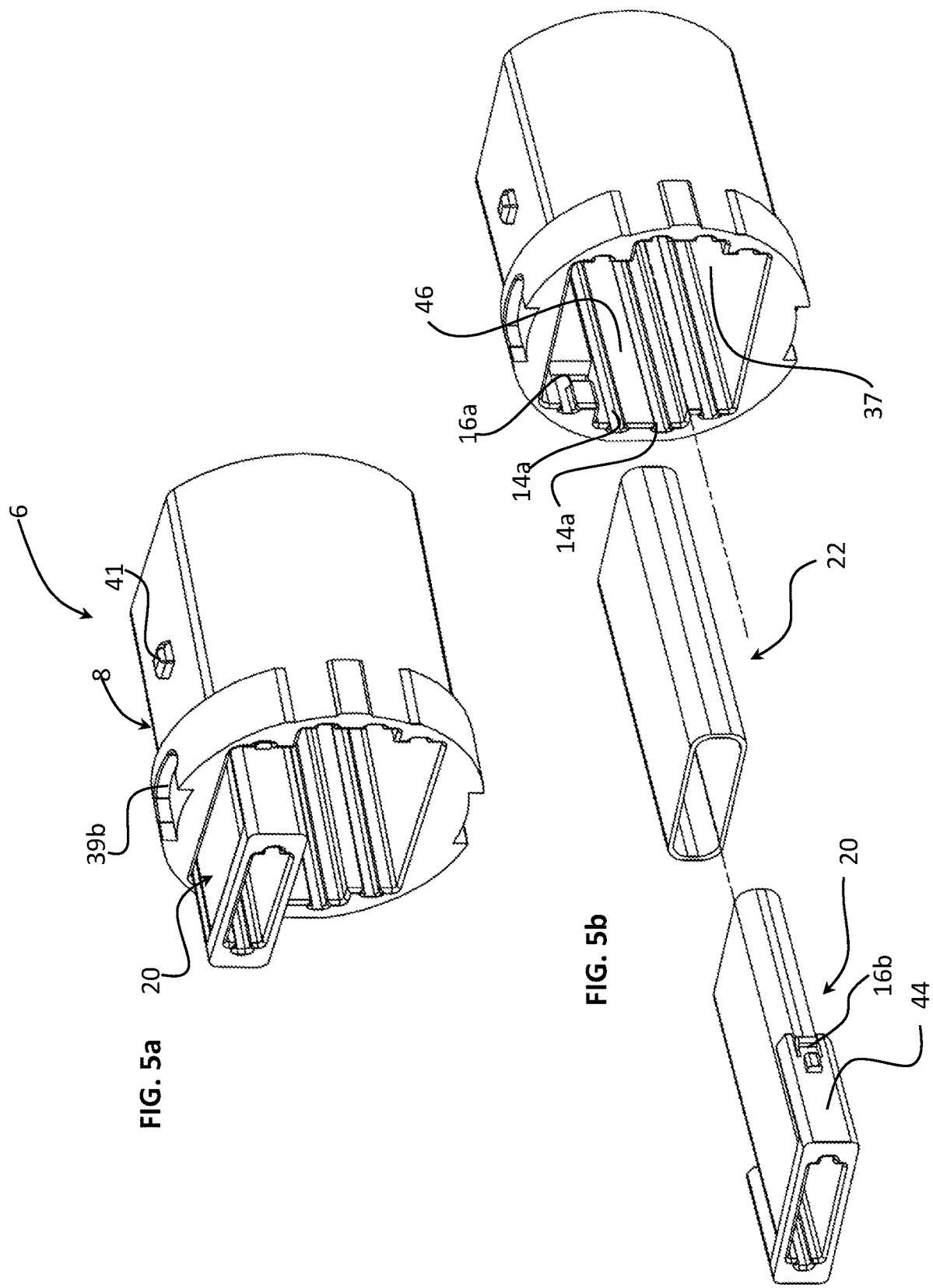

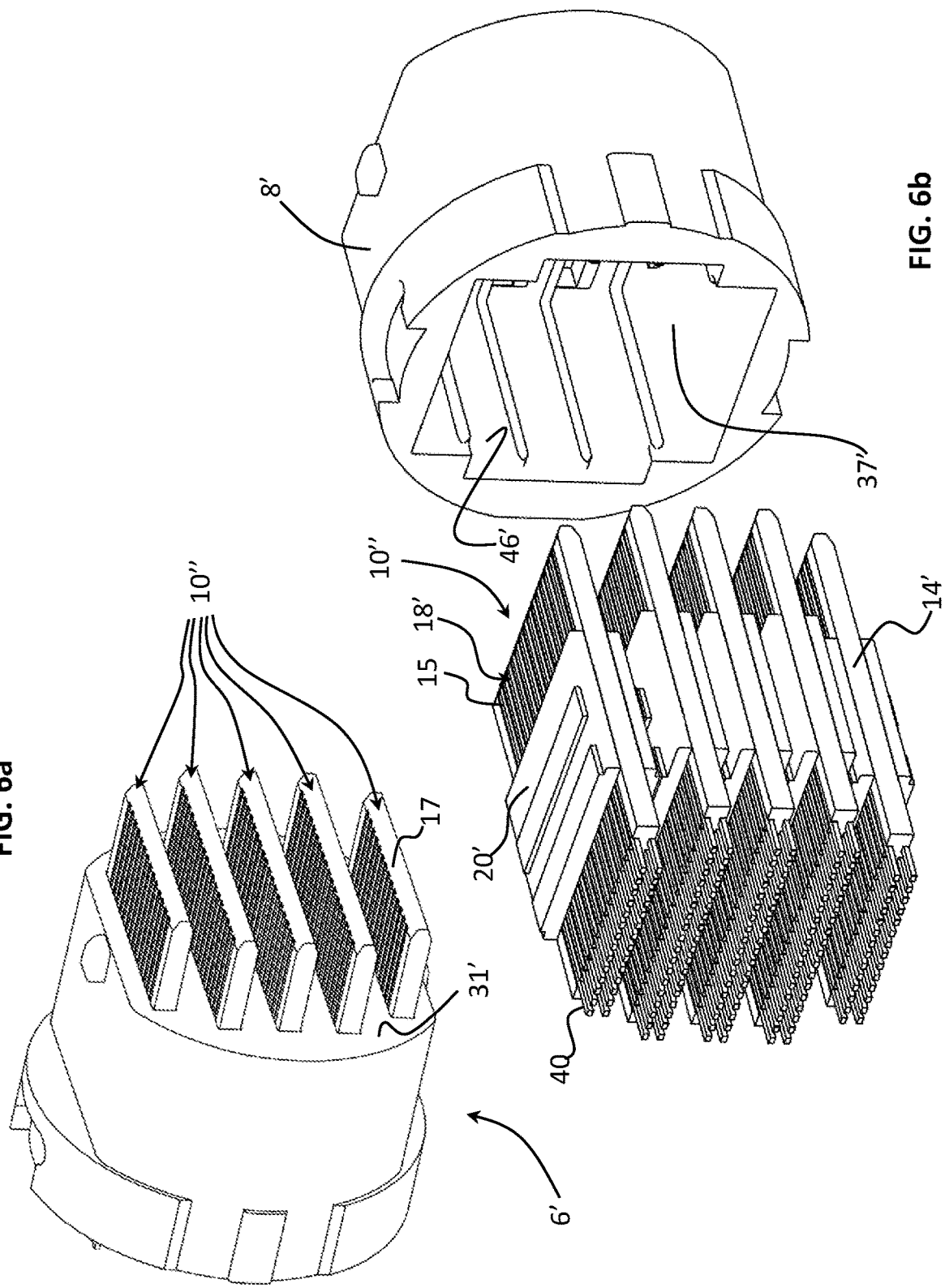

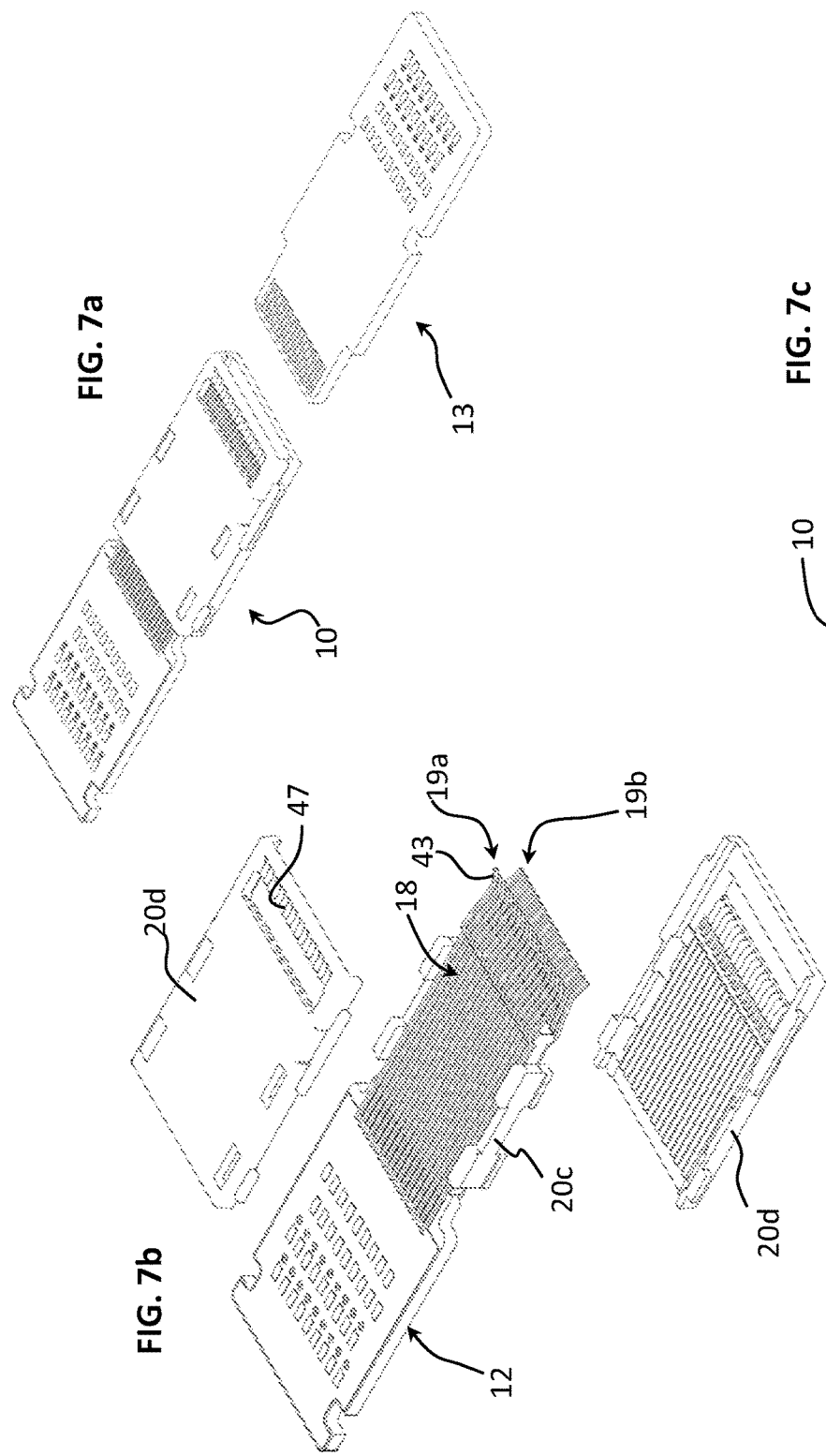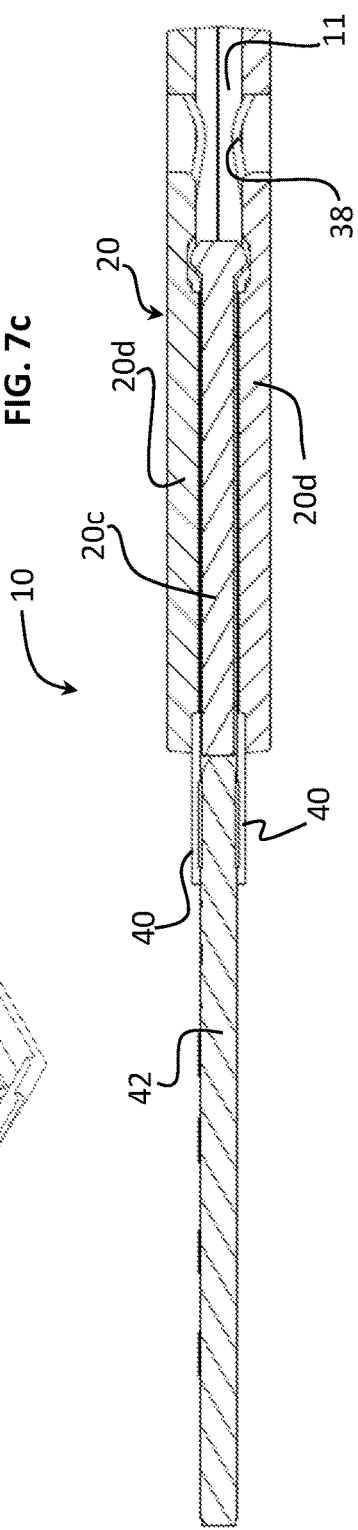

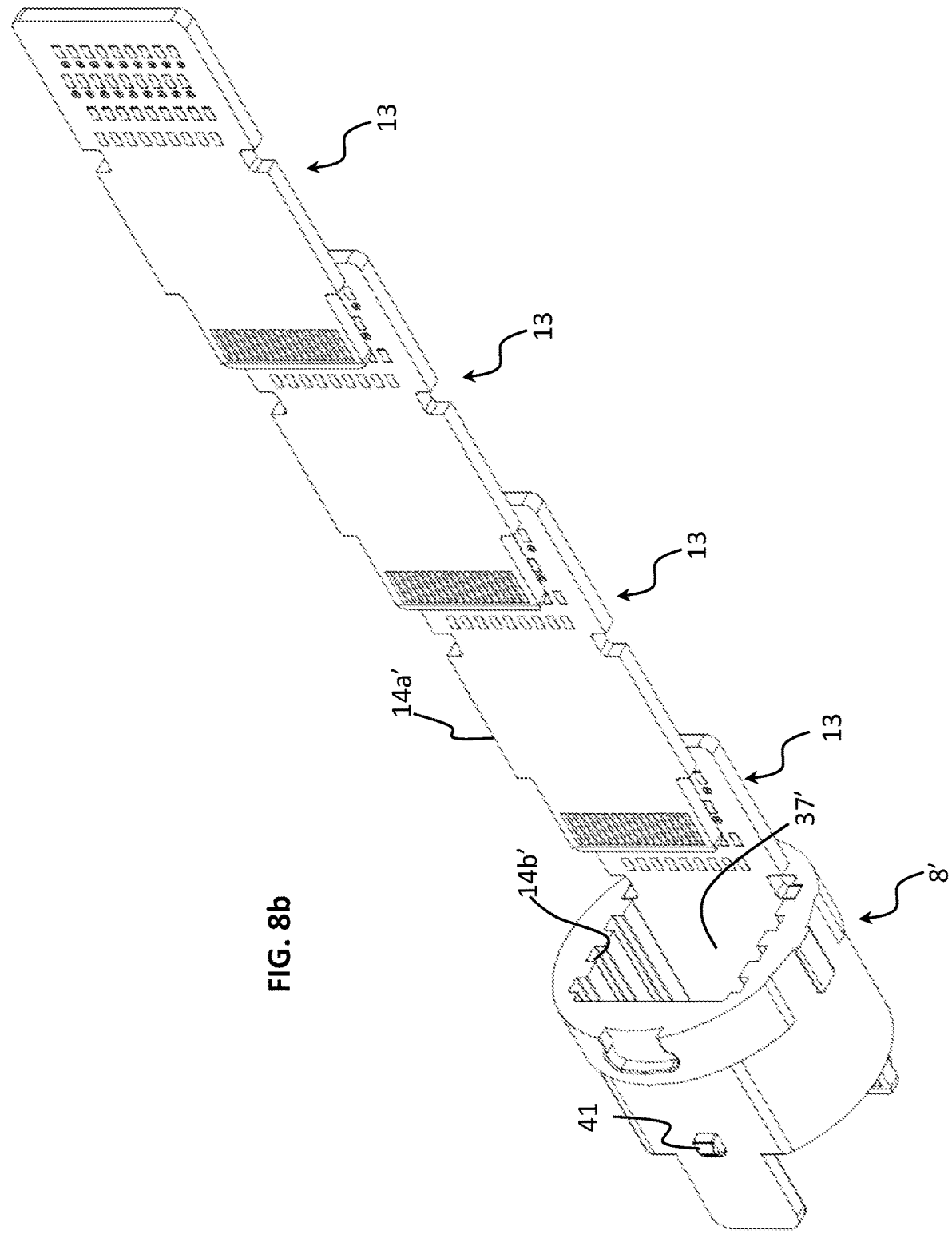

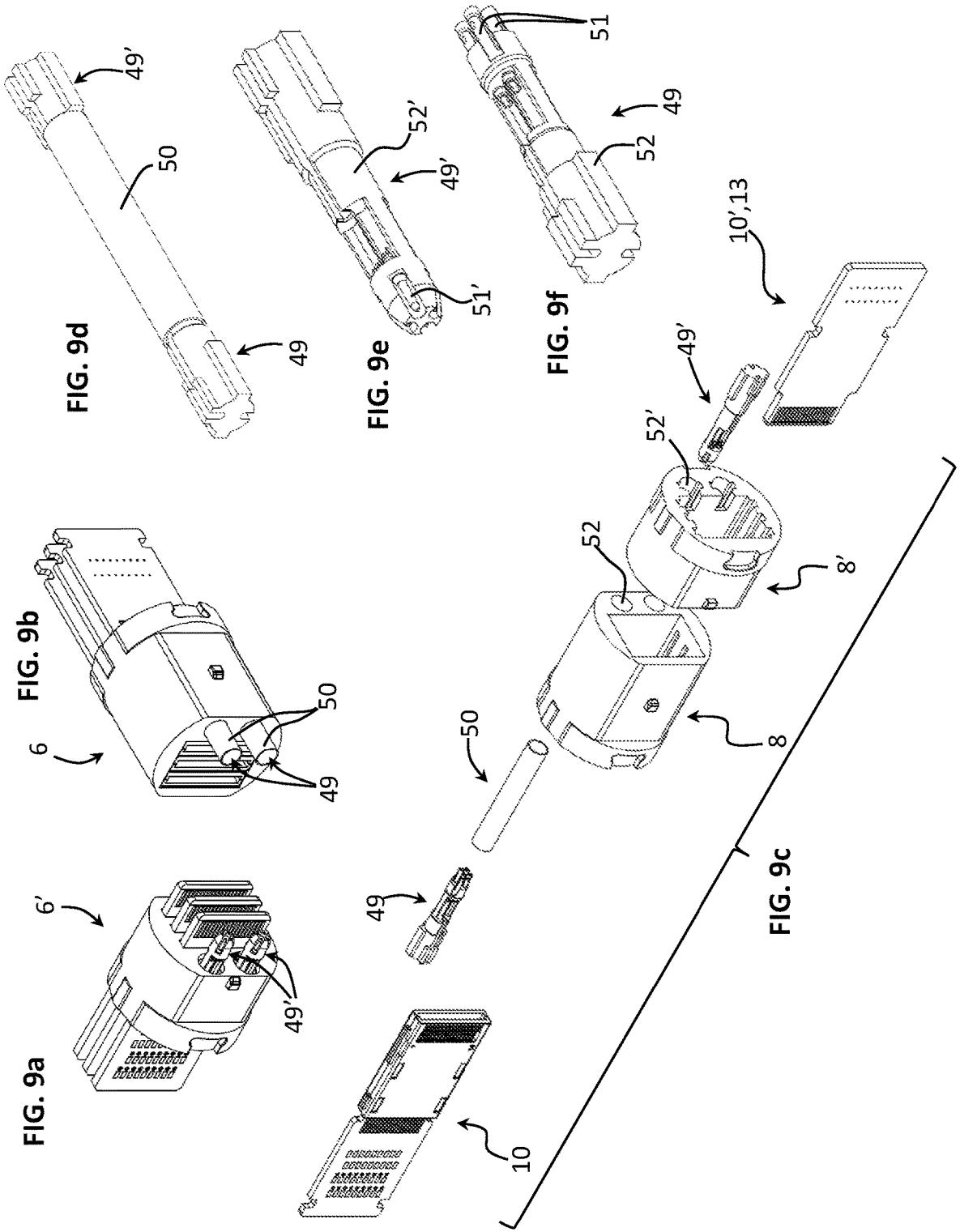

HIGH DENSITY CONNECTOR

CROSS-REFERENCE TO RELATED APPLICATIONS

The present application is a national stage entry of International (PCT) Patent Application No. PCT/EP2019/062686, filed May 16, 2019, which in turn claims priority to European Patent Application No. 18172519.3, filed May 16, 2018, and U.S. Provisional Application No. 62/672,242, filed May 16, 2018, the subject matter of which are expressly incorporated herein by reference.

The present invention relates to a high density pluggable electrical connector.

Certain applications require a high number of electrical contacts for signal, data and power communication in a single pluggable connector with a small diameter or cross-sectional surface area. Such connectors are found for instance in medical equipment or in test and measurement equipment. In certain applications the number of electrical contacts that are required may exceed one hundred. In many conventional solutions, a plurality of connectors are provided to satisfy the requirement for a number of electrical connections. Conventional high density electrical connectors are difficult to connect to individual conductors of a cable. Moreover, in a situation where an interconnection is faulty, repairing the faulty interconnection may also be very difficult and costly. Since the cable may be connected to expensive equipment, the ability to test and repair the high density electrical connector is often required.

In certain applications, for instance in medical applications subject to strong magnetic fields, such as in Magnetic Resonance Imaging (MRI) and magnetic catheter navigation, an added complication is the need to shield the electrical contacts from the strong magnetic field, which adds to the size and complexity of the connector.

In view of the foregoing, it is an object of the invention to provide a high density pluggable electrical connector for applications requiring more than 50 contacts with an overall density at the plugging interface of not less than 30 contacts per square centimeter, to that is easy to interconnect to conducting leads, and that is easy to test and repair if needed.

It is advantageous to provide a high density pluggable electrical connector that can be easily modified for different uses or requirements.

It is advantageous to provide a high density pluggable electrical connector that is cost effective to manufacture and assemble.

In certain applications, it is advantageous to provide a high density pluggable electrical connector that has good shielding against magnetic fields.

It is advantageous to provide a high density pluggable electrical connector, especially for medical applications, that is easy to sterilize.

It is advantageous to provide a high density pluggable electrical connector that has a small overall diameter/size allowing it to fit within small spaces, for instance within a catheter tube, hand piece or handle of a medical instrument.

It is advantageous to provide an electrical connector that is versatile and allows various connection techniques and possibilities for interconnection to a cable and other conducting lead arrangements.

It is advantageous to provide a high density pluggable electrical connector that has a low plugging force with a mating connector, yet ensures reliable electrical interconnection.

Objects of this invention have been achieved by providing a high density connector according to claim 1.

Objects of this invention have been achieved by providing a high density pluggable electrical connector system according to claim 17.

Disclosed herein is a high density pluggable electrical connector comprising a casing and a terminal unit mounted within the casing, the terminal unit comprising a housing with a module receiving cavity formed within the housing, and a plurality of terminal modules insertably received in the module receiving cavity in a stacked arrangement, each terminal module comprising a plurality of contacts mounted in a dielectric terminal module housing, and a connection board connected to the plurality of contacts.

The connector comprises a number of electrical contacts exceeding sixty and a contact density on a plugging interface of the connector of at least forty contacts per square centimeter, said terminal module having a width W to height H ratio W/H greater than three (W/H>3).

The contacts of each terminal module comprise spring plugging contact portions arranged in two rows forming a receptacle slot configured for receiving a male contact arrangement of a mating connector therein.

The contacts of each terminal module further comprise connection portions at an opposite end of the contact to the plugging contact portions configured for connection to the connection board.

In an embodiment, at least one of the terminal modules comprises a magnetic shield surrounding the terminal module housing.

In an advantageous embodiment, the connection board comprises contact pads at a leading edge of the connection board insertable between said connection portions of the contacts for electrical interconnection thereto.

In an advantageous embodiment, the connection board comprises wire connection pads arranged in at least two or more rows and at least five or more columns on both sides of the connection board, preferably in at least three or more rows and at least eight or more columns on both sides of the connection board, for connection to conductive wires or leads of a cable or conductor arrangement.

In an embodiment, the connection board may comprise electrical components for filtering signals or providing signal processing functions, connected to one or more electrical circuit traces interconnecting the contact pads to the wire connection pads.

In an advantageous embodiment, said terminal module comprises insertion guide members that cooperate with complementary guide members in the module receiving cavity of the housing to allow insertion of each terminal module in the housing at a defined level in the stack of the plurality of terminal modules.

In an advantageous embodiment, the guide member on the terminal module is in the form of an axially extending protuberance or bead received in a corresponding complementary axially extending recess or groove in a sidewall of the module receiving cavity.

In an advantageous embodiment, said terminal module may comprise at least one locking element, on a lateral minor side of the terminal module housing that latches with at least one complementary latching member in the sidewall of the module receiving cavity.

In an advantageous embodiment, the guide members on the housing and terminal module are configured to allow the plurality of terminal modules to be inserted into the terminal housing in an axial direction (A) that corresponds to a plugging direction of the connector with a mating connector, and to be stacked one on top of each other.

In an embodiment, the connector comprises a number of electrical contacts exceeding one hundred and a contact density on a plugging interface of the connector of at least fifty contacts per square centimeter.

In an advantageous embodiment, the connector may further comprise electrical power contacts for electrical power supply, mounted directly in the housing of the terminal unit and positioned above and/or below the stack of modules.

In an advantageous embodiment, the connector may further comprise a magnetically shielded contact unit mounted in the terminal housing above and/or below the stack of terminal modules, the contact unit comprising a magnetic shielding sheath, an insulating housing insertable in the shielding sheath, and one or a plurality of contacts mounted and supported in said insulating housing, the shielded contact unit insertably mounted in a corresponding cavity of the terminal unit housing above and/or below the stack of terminal modules.

The magnetic shielding sheath may advantageously have a cylindrical or generally cylindrical shape.

The magnetic shielding sheath may advantageously have a length to diameter ratio of at least three.

Also disclosed herein is a high density pluggable electrical connector system comprising any of the embodiments of the connector set forth above (the female connector), and a mating connector (the male connector) pluggably connectable and disconnectable thereto, the mating connector comprising a plurality of terminal modules in a stacked arrangement, each comprising or consisting of a connection board comprising a plurality of contact pads arranged in a juxtaposed manner along a leading edge of the connection board for pluggable connection to a corresponding said plurality of contacts of said connector. The connector may be considered the female connector in view of the pair of contact rows forming a receptacle, and the mating connector may be considered to be the male connector in view of the connection board plugging end insertable into the corresponding receptacle of the female connector.

In an embodiment, the mating connector may comprise a casing and a terminal unit mounted within the casing, the terminal unit comprising a housing with a module receiving cavity formed within the housing, said plurality of terminal modules insertably received in the module receiving cavity.

The terminal modules of the mating connector may advantageously consist of connection boards, the contacts thereon being formed by contact pads on the connection boards.

Similar to the connection boards of the above described connector, the connection boards of the mating male connector may advantageously comprise at an end distal from the plugging end, wire connection pads arranged in at least two or more rows and at least five or more columns on both sides of the connection board, preferably in at least three or more rows and at least eight or more columns on both sides of the connection board, for connection to conductive wires or leads of a cable or conductor arrangement.

In an advantageous embodiment, the mating male connector may further comprise a magnetically shielded contact unit mounted in the terminal housing above and/or below the stack of terminal modules, the contact unit comprising an insulating housing insertable in the magnetic shielding sheath, and one or a plurality of contacts mounted and supported in said insulating housing, the shielded contact unit insertably mounted in a corresponding cavity of the terminal unit housing above and/or below the stack of terminal modules.

Further objects and advantageous features of the invention will be apparent from the claims, from the detailed description, and annexed drawings, in which:

FIG. 1b is a cross sectional view of the mating pluggable connectors of FIG. 1a;

FIG. 1c is a perspective exploded view of the first connector of FIG. 1a;

FIG. 1d is a perspective exploded view of the second connector of FIG. 1a;

FIG. 1e is a perspective cross-sectional view of part of the first and second connectors of FIG. 1a;

FIG. 2a is a perspective view of a terminal unit of a high density pluggable electrical connector according to an embodiment of the invention seen from a plugging interface side;

FIG. 2b is a perspective view of the terminal unit of FIG. 2a and connection board seen from a termination side;

FIG. 4a is view of the plugging interface side of the terminal module of FIG. 3;

FIG. 4b is a cross-sectional view through line IVb-IVb- of FIG. 4a;

FIG. 4c is a perspective exploded view of the terminal module of FIG. 4a

FIG. 5a is a perspective view of a terminal unit of a high density pluggable electrical connector, with contacts removed, according to an embodiment of the invention seen from a termination side;

FIG. 5b is an exploded view of the terminal unit of FIG. 5a;

FIG. 6a is a perspective view of a terminal unit of the second connector of a high density pluggable electrical connector system according to another embodiment of the invention seen from a plugging interface side;

FIG. 6b is a perspective view of the terminal unit of FIG. 6a seen from a termination side, with terminal modules shown outside the housing of the terminal unit, prior to assembly;

FIG. 7a is a perspective view of a terminal module and mating terminal module according to another embodiment of the invention;

FIG. 7b is a perspective exploded view of the terminal module of FIG. 7a;

FIG. 7c is a cross-sectional view of the terminal module of FIG. 7a;

FIG. 8b is a perspective exploded view of a mating terminal unit with the mating terminal modules of FIG. 7a according to another embodiment of the invention.

FIGS. 9a and 9b are perspective views of a terminal unit of a male connector (FIG. 9a) and terminal unit of a mating female connector (FIG. 9b) of a high density pluggable electrical connector system according to another embodiment of the invention;

FIG. 9c is an exploded perspective view of some components of the connector system of FIGS. 9a, 9b;

FIG. 9d is a perspective view of magnetically shielded contact units of the connector system of FIGS. 9a, 9b;

FIGS. 9e and 9f are perspective views of contact modules of the magnetically shielded contact units of FIG. 9d.

Figure 1A:
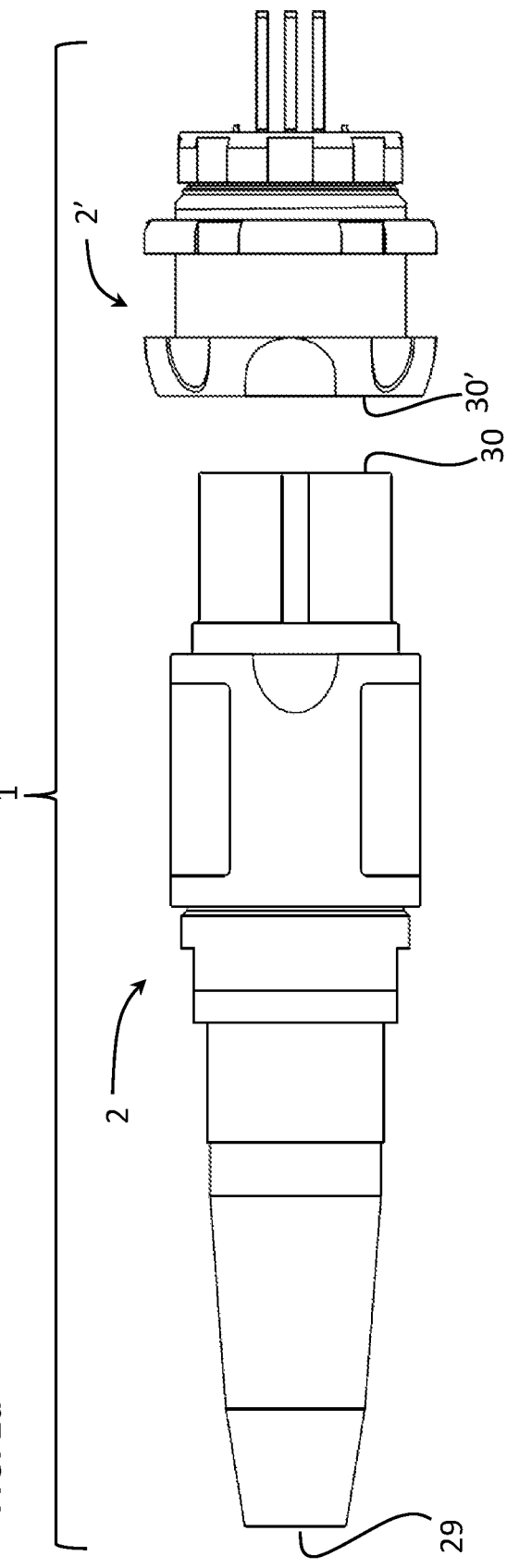
FIG. 1a is a side view of a high density pluggable electrical connector system according an embodiment of the invention, illustrating a first connector pluggable to a mating second connector.

Referring to the figures, a high density pluggable electrical connector system 1 according an embodiment of the invention comprises a high density pluggable electrical connector 2 and a mating electrical connector 2', the connectors 2, 2' being pluggably connectable and disconnectable in an axial direction A.

In the illustrated embodiment, the high density pluggable electrical connector 2 is configured for termination to a multi conductor cable (not shown), and the mating connector 2' is configured for mounting on a panel or device (not shown). In the illustrated example, the mating connector 2' comprises locking rings 34', 36', at least one of which threadably engages an outer thread on the casing 4' to tighten/lock the connector 2' to the panel or device.

However, within the scope of the invention, the mating connector may also be a cable connector, instead of a panel or device mounted connector, configured for termination to a multi conductor cable (not shown) similar to the pluggable cable connector 2.

The high density pluggable electrical connector 2 according to embodiments of this invention comprises a terminal unit 6 housed within a casing 4. The terminal unit 6 comprises a dielectric housing 8 within which a plurality of terminal modules 10 are inserted and fixed. The casing 4 and terminal unit 6 present a plugging interface 31, 30 for coupling to a complementary plugging interface of a mating connector 2'.

The mating connector 2' according to embodiments of this invention may also comprise a terminal unit 6' housed within a casing 4'. The terminal unit 6' comprises a dielectric housing 8' within which a plurality of terminal modules 10' are inserted and fixed. The casing 4' and terminal unit 6' present a plugging interface 31', 30' for coupling to the plugging interface 31, 30 of the high density pluggable electrical connector 2.

In the illustrated embodiment of the pluggable high density cable connector 2, the casing 4 of the connector 2 extends axially from a cable exit end 29 to a plugging interface 30 and comprises an inner shell 32 that mounts around a rear end of the terminal unit 6, and an outer shell 36, 34 mounted around the terminal unit 6 and inner shell 32. The outer shell comprises a mating end locking ring 36 inserted over a plugging end of the terminal unit and a cable end locking ring 34 mounted over a cable exit end of the inner shell. A cable exit guide 28 may further be provided, coupled to the cable end locking ring. The inner shell 32 may for instance be in the form of half shells that enable assembly around the rear end of the terminal unit 8, the inner shell and terminal unit being provided with interengaging positioning and locking means such as complementary protuberances and recesses 39a, 39b, that securely lock the terminal unit to the inner shell in a fixed angular and axial position.

The casing 4, 4' of the connectors 2, 2' may be made of various materials including, for instance, in metal to provide a durable connector. The metallic casing may optionally also be connected to an electrical ground connection for electrical shielding of the terminal unit 6, 6' mounted therein. In a variant, the casing may also comprise a magnetic shielding material to provide shielding against strong magnetic fields for applications in which the connector is subject to strong magnetic fields such as in MRI or other applications.

In the illustrated embodiment, the cable exit end 34, 28 is axially aligned with the plugging direction A, however it may be appreciated that various cable outlet directions are possible such as right angle, or at any oblique angle. Moreover, the shape of the cable may be round or have various other shapes such as generally rectangular and flat. The cable exit end may therefore have various configurations as discussed above without departing from the scope of the invention. The casing plugging interface 30 comprises guiding and locking elements for guiding and locking the connector to the mating connector. The inner shell 32 in the form of two or more inner shell parts that mount laterally around the rear end of the terminal unit 6 enables the terminal unit to be connected to leads of a cable inserted through the cable exit guide 28 and cable end locking ring 34 without interference from other casing parts, enabling also easy repair or modification to the terminal unit by complete removal of the casing locking rings 34, 36 and inner shell parts 32. Such casing configurations are per se known and do not need to be further described.

The housing 8 of the terminal unit comprises a module receiving cavity 37 within which a plurality of terminal modules 10 are insertably received in a stacked manner as best illustrated in FIGS. 1e, 2a-2c, 5a, 5b The housing 8' of the terminal unit of the mating connector 2' may also comprise a module receiving cavity 37' within which a plurality of terminal modules 10' are insertably received in a stacked manner as best illustrated in FIGS. 1d, 1e, 6a, 6b.

Each terminal module 10 of the high density pluggable electrical connector 2 comprises a plurality of electrical contacts 18 mounted in a dielectric terminal module housing 20. The dielectric housing 20 may be made of one or more parts, either molded over the contacts 18 and/or assembled to the contacts 18. In a preferred embodiment, the electrical contacts 18 are advantageously arranged in two contact rows 19a, 19b. The pair of contact rows provides optimal access for connection to conducting leads of a cable or other conducting arrangement connected to the connector, as will be described in more detail hereinafter.

In the embodiment illustrated in FIGS. 4a to 4c, the each contact row of the pair of contact rows 19a, 19b are supported by a first housing portion 20a, for instance overmolded by the first housing portion 20a, and inserted in a second outer housing portion 20b. The free ends 43 of the contacts 18, at the plugging interface end, press against the inner surfaces 45 of the second outer housing portion 20b when the mating plug is inserted between the pair of opposing contacts 18.

In the embodiment illustrated in FIGS. 7a to 7c, the pair of contact rows 19a, 19b are separated by a first housing portion 20c positioned between the contact rows, second outer housing portions 20d are assembled over the contact rows on opposite sides. The second outer housing portions may for instance be welded or bonded together. In this embodiment, the opposing contacts 18 are elastically prestressed towards each other, whereby when the mating plug is not inserted between the pair of opposing contacts 18, the free ends 43 of the contacts 18, at the plugging interface end, press against outer surfaces 47 of the second outer housing portion 20d.

The contacts 18 extend from a plugging contact portion 38 to a connection portion 40 for connection to a connection board 12 or other conducting arrangement. The plugging contact portions 38 are configured for pluggable connection to mating contacts of the mating connector 2'.

In the illustrated embodiments, the plugging contact portions 38 are in the form of spring contacts, for instance comprising convex elastic beam portions, arranged in two opposed contact rows 19a, 19b forming a receptacle slot 11 configured for receiving a male contact arrangement of the mating connector 2' therein.

Figure 1B:
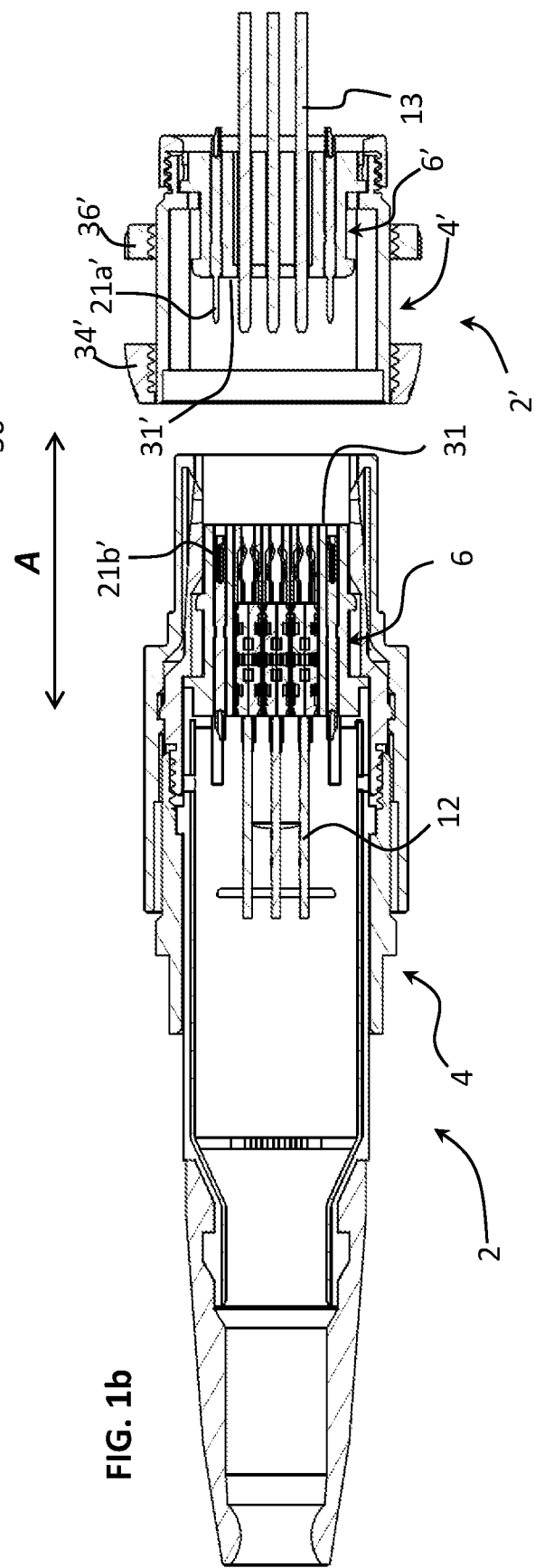
Figure 1E:
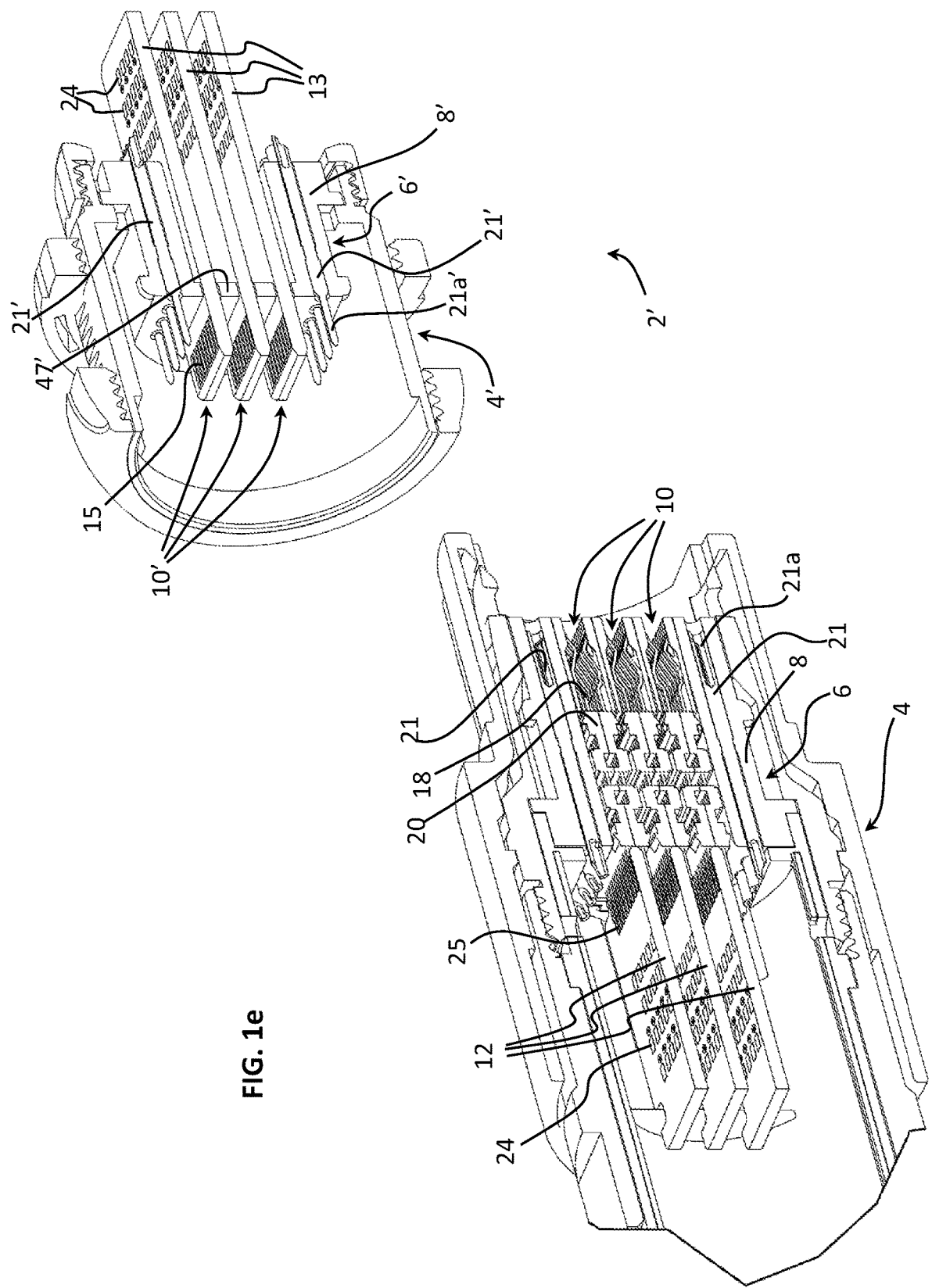
Figure 2C:
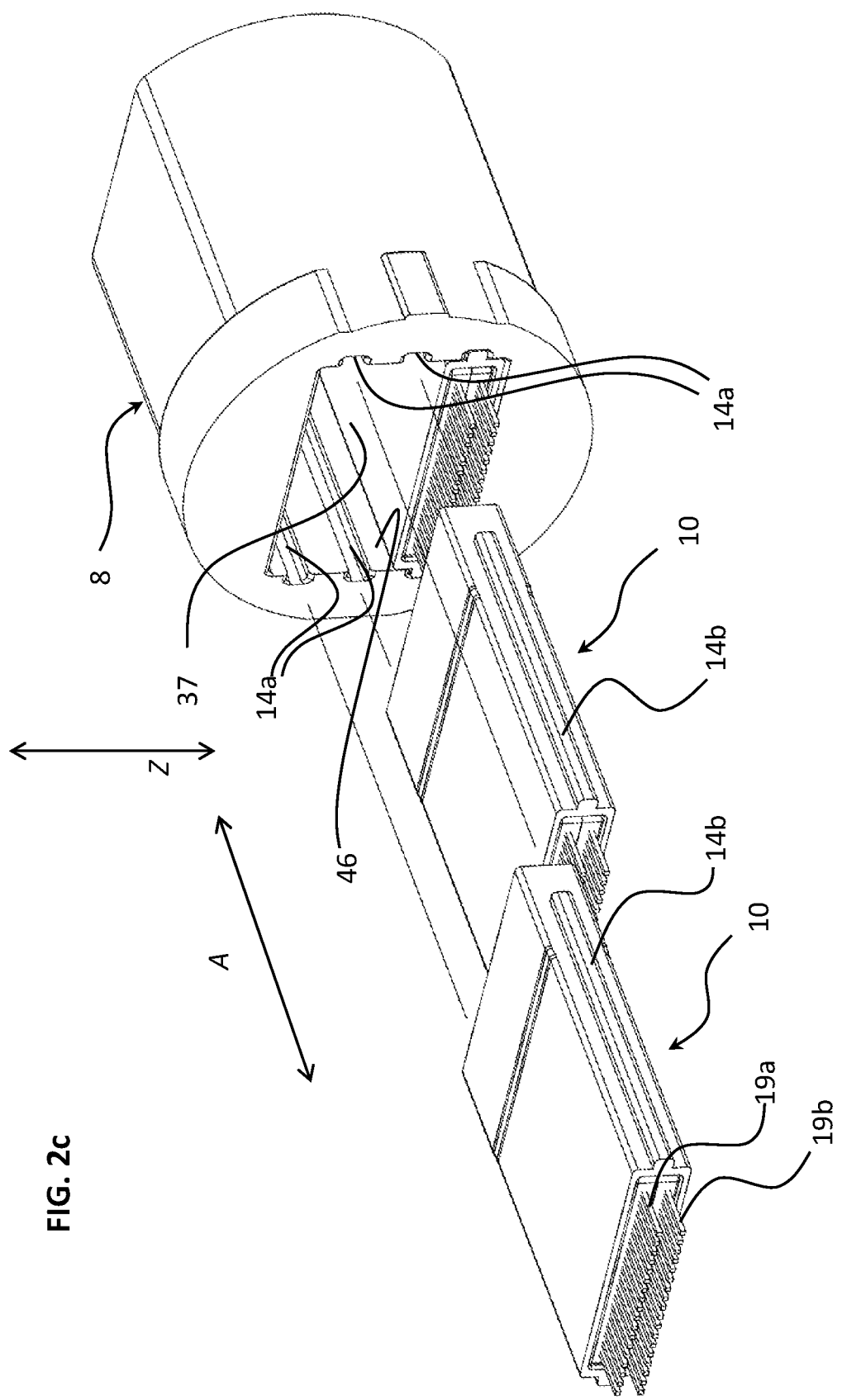
FIG. 2c is a perspective view of the terminal unit of FIGS. 2a and 2b, showing terminal modules disassembled from a housing of the terminal unit.
Figure 3:
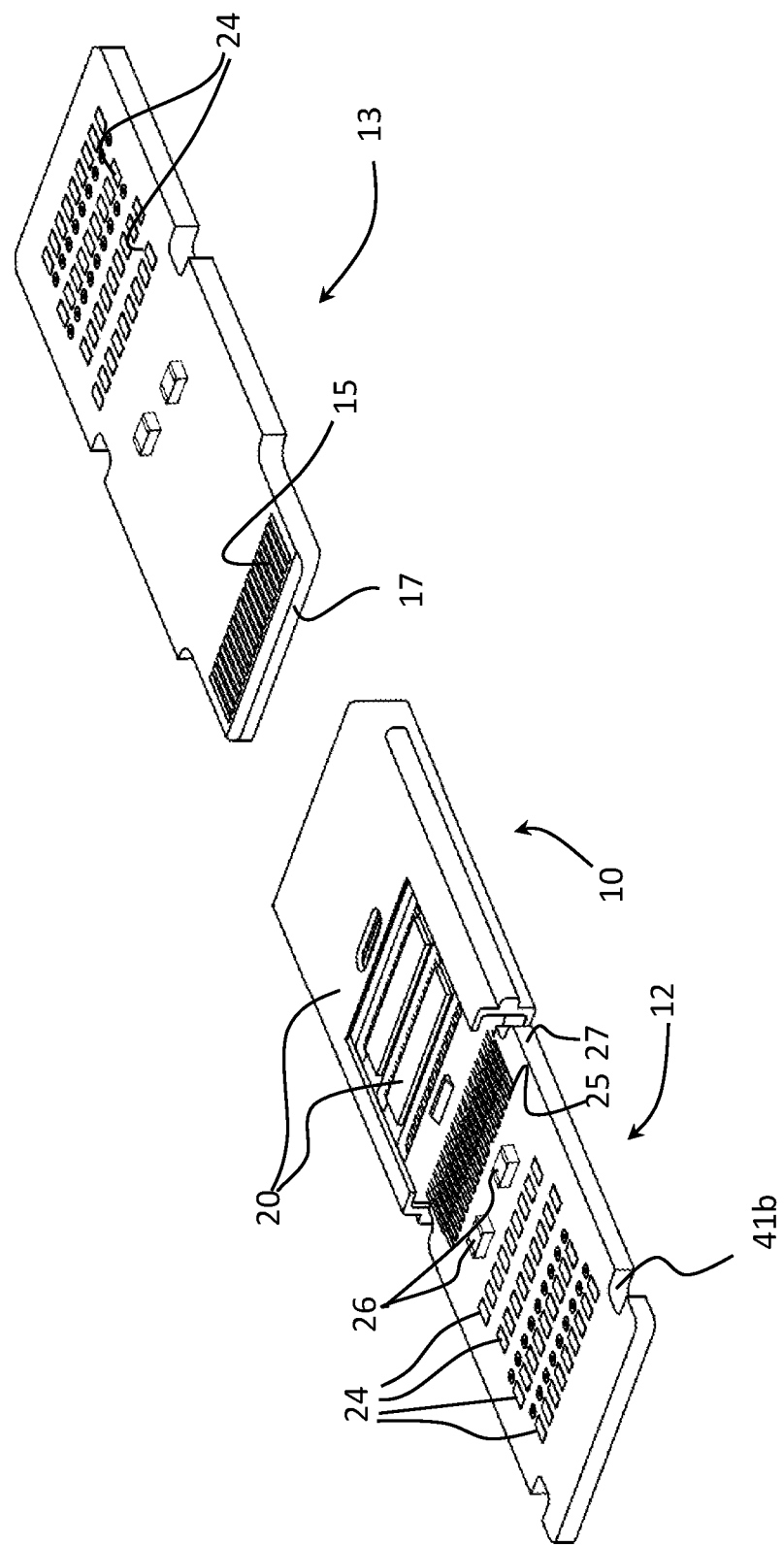
FIG. 3 is a perspective view of a terminal module of the first connector and a mating connection board of the second connector of the embodiment of FIGS. 1a to 1e in an unplugged state.
Figure 8A:
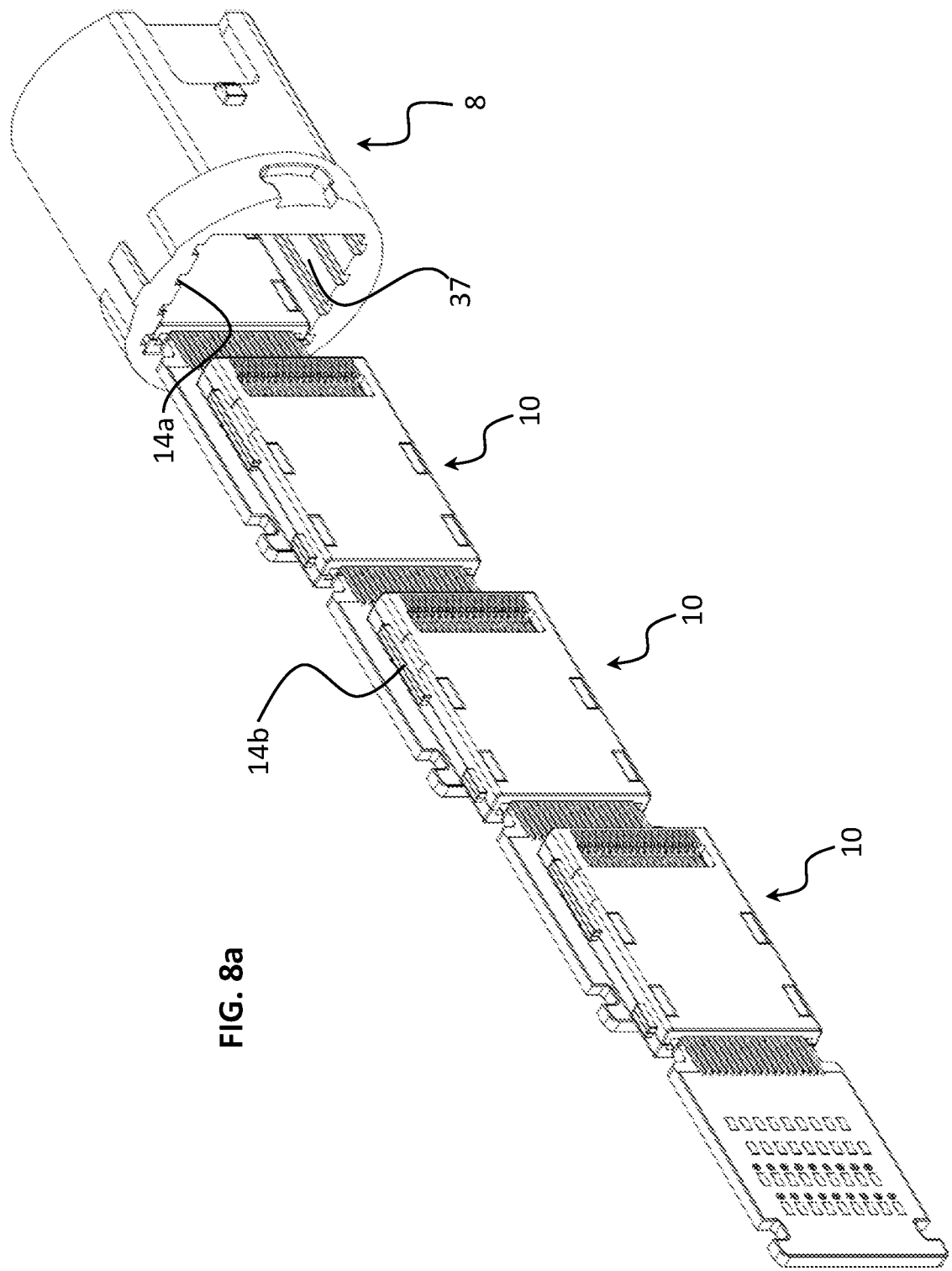
FIG. 8a is a perspective exploded view of a terminal unit with the terminal modules of FIG. 7a according to another embodiment of the invention.

As best illustrated in FIGS. 1b, 1e, 3, the mating connector 2' may be provided with a connection board 13 comprising contact pads 15 arranged in a juxtaposed manner along a leading edge 17 of the connection board 13, the contact pads being formed on opposed sides of the connection board and interconnected via conductive circuit traces (not shown) to wire connection pads 24 for connection to conductive leads of a conductor arrangement (not shown) of the mating connector 2'. The leading edge 17 is inserted into the receptacle slot 11 of the terminal module 10 such that the spring contacts 38 on both sides of the terminal module 10 receptacle press elastically against corresponding respective contact pads 15 on opposite sides of the connection board 13 and clamp the connection board 13 therebetween.

The connection boards may be provided with locking elements, for instance a locking recess 41b (see FIGS. 1c and 3) that engage complementary locking elements, for instance a locking rib 41a on the casing, for instance the casing inner shell 32. This secures the connection boards in correct position relative to the terminal unit 6.

Other per se known contact configurations for pluggable contact that allow a high density of contacts may be used without departing from the scope of the present invention.

The connection portions 40 of the contacts 18 are in the illustrated embodiments configured for solder or weld connection to a connection board 12 for each terminal module 10. The connection boards 12 and corresponding terminal modules 10 and housing 8 form part of the terminal unit 6. As best seen in FIGS. 2b, 4b and 4c, the connection portions 40 of the contacts 18 of each terminal module are arranged in two rows forming a space 42 therebetween for receiving an edge 27 of the connection board 12 therebetween. The connection board 12 comprises a plurality of contact pads 25 provided at the leading edge 27 on both sides of the board against which corresponding connection portions 40 of the contacts 18 are connected, in particular by soldering or welding. In a variant, the connection portions 40 may comprise spring contacts that elastically bias against the contact pads 25 for establishing electrical connection therebetween.

The contact pads 25 are interconnected via conductive circuit traces on the board to wire connection pads 24. The wire connection pads may advantageously be arranged in a plurality of rows and columns in a spaced part manner to provide convenient spacing for establishing the connection to leads of a cable or other conductor arrangement. Preferably there are at least three or more rows and at least eight or more columns of contact pads on both sides of connection board.

Electronic or electrical components 26 may be mounted on the connection board 12, connected to one or more of the electrical circuit traces for filtering signals or providing other signal processing functions in the electrical paths of one or more conductors. The distribution of wire connection pads over a certain surface area of the board advantageously facilitates the interconnection by welding, soldering or other wire to board connections techniques, and facilitates repair or replacement of an interconnection.

Similarly, the connection board 13 of the mating connector terminal module 10' may comprise contact pads 15 interconnected via conductive circuit traces on the board to wire connection pads 24 arranged in a plurality of rows and columns in a spaced part manner to provide convenient spacing for establishing the connection to leads of a cable or other conductor arrangement. Preferably there are at least three or more rows and at least eight or more columns of contact pads on both sides of connection board. Electronic or electrical components 26 connected to one or more of the electrical circuit traces for filtering signals or providing other signal processing functions in the electrical paths of one or more conductors may also be mounted on the connection board 13.

The connection boards 12, 13 further advantageously allows the interconnection to conducting leads or wires to be separated from the terminal modules 10, 10' and housings 8, 8' facilitating individual replacement, repair or testing of each terminal module independently of the other terminal modules 10, 10' which can also be independently removed and replaced. In addition, the interconnection of wires of a cable to the connection boards 12, 13 can be performed separately from the configuration of the terminal module 10, 10' thus providing versatility in the connection arrangements without a change in the plugging interface 31, 31' of the connector 2, 2'.

The connection boards 12, 13 also provide easy access to opposite sides of the boards for the wiring interconnection while enabling a densely stacked connection arrangement once inserted into the corresponding terminal modules 10, 10'.

The connections boards 12, 13 may be in the form of printed circuit boards, or may comprise stamped and formed contacts, for instance stamped and formed from a lead frame, the contacts overmolded, stitched or assembled in an insulating body to form a single integrally formed terminal module. In the embodiment illustrated in FIG. 6a, 6b, the contacts 18' are stamped metal contacts overmolded in an insulating body 20' to form unitary single piece terminal modules 10".

Within the scope of the invention, the terminal module 10, 10', 10" may be connected to conductive leads or wires of a cable or other conducting arrangement by other means, such as direct wire to contact bonding (welding, soldering) or insulation displacement contacts (IDC). The connection portions 40 of the contacts 18, 18' may have a staggered relationship to be arranged in a plurality of rows and columns, similar to the spacing arrangement of the contact pads 24, to facilitate interconnection to conductive leads of a cable. The contacts 18, 18' may be stamped and formed from a lead frame and be overmolded, stitched or assembled in an insulating body to form a single integrally formed terminal module.

Each terminal module 10 of the high density pluggable electrical connector 2 may advantageously be provided with insertion guide members 14 that cooperate with complementary guide members 14a in the module receiving cavity 37 of the housing 8 to allow axial insertion of the terminal modules in the housing at a defined level in the stack of the plurality of terminal modules 10. In the illustrated embodiment (FIGS. 2c, 5a), the guide member 14b on the terminal module is in the form of an axially extending protuberance or bead that received in a corresponding complementary axially extending recess or groove in the sidewall 46 of the module receiving cavity 37.

Each terminal module may advantageously have a ratio H/W between the overall height H in the stacking direction Z to the overall width W, that is less than 30 percent, preferably in the range of 20 to 30 percent. The aforementioned ratio provides for an advantageous distribution of the electrical contacts, in particular for ease of interconnection to wires of a cable while providing a high connection density.

Each terminal module may further be provided with latching elements 16b (see FIG. 5b), preferably on lateral minor sides 44 that latch with complementary latching shoulders 16a, in the sidewall 46 of the module receiving cavity 37.

In an embodiment, one or more, or every, terminal module 10 may comprise a magnetic shield 22 that surrounds the terminal module housing 20 (see FIG. 5b). The magnetic shield 22 may for instance be in the form of a magnetic material that is bent into a substantially rectangular shape to fit snugly around the terminal module housing 20, for instance inserted thereover in the axial direction A.

The complementary guide members 14a, 14b on the housing 8 and terminal module 10 are configured to allow the plurality of terminal modules to be inserted into the terminal housing in an axial direction A that corresponds to a plugging direction of the connector, and to be stacked one on top of each other.

The mating connector 2' may also comprise terminal modules 10', 10" removably insertable in a housing 8' of a terminal unit 6' with the same or similar features described above for the terminal modules of the pluggable cable connector 2 to allow repair and replacement of the modules. In particular each terminal module 10' of the mating connector 2' may be provided with insertion guide members 14b', for instance formed by lateral edges of the connection boards 13 or overmolded body 20' that cooperate with complementary guide members 14a' in sidewalls 46' of the module receiving cavity 37' of the housing 8' to allow axial insertion of the terminal modules 10', 10" in the housing at a defined level in the stack of the plurality of terminal modules. The frontwall 47' (see FIG. 1e) of the housing 8' may also comprise slots through which the front ends of the terminal modules 10', 10" are inserted to securely position and hold the terminal modules in the stacked arrangement.

In an advantageous embodiment, the terminal modules 10, 10', 10" may be arranged such that they may be individually extracted out of the terminal housing 8, 8' in order to replace or repair a terminal module, for instance in case of a defective plugging contact portion 38 or in case of a defective interconnection to wires of a cable connected to the connector 2, 2'.

In the embodiment illustrated in FIGS. 2a to 2b, each of the plurality of terminal modules 10, 10' of one connector 2, 2' is identically formed or substantially identically formed. In variants, terminal modules with different configurations may be inserted in a terminal housing. For instance, for circular connectors (as illustrated), the upper and lower terminal modules of the stack may have a smaller width than the center module(s).

Magnetic shielding 22 may be provided around one, or some of a plurality, or every one, of the terminal modules 10 of the terminal unit 6. Shielding may also be provided in a similar manner for the terminal modules 10', 10" of the mating connector 2'. For terminal modules where a magnetic shielding is not required, for instance for power or non-critical electrical contacts, magnetic shielding may be omitted. The magnetic shield 22 positioned around a corresponding terminal module 10, 10' may be in addition to a magnetic shield positioned around the terminal unit 6, 6' for instance the casing 4, 4' with magnetic shielding properties.

In an advantageous embodiment, the plugging interface 31, 31' of the connector 2, 2' comprises more than forty contacts 18, 18' per square centimeter, typically more than fifty contacts per square centimeter, for instance in a range of 60 to 100 contacts per square centimeter, while enabling easy connection, testing, and maintenance of conducting leads. The connector 2, 2' according to embodiments of the invention may advantageously be used for connection to wire conductors in a range of 22 AWG (American Wire Gauge) (0.6438 mm diameter) to as small as 54 AWG (0.01575 mm diameter).

Use of modular terminal units allows service replacement without the re-termination of all conductors of the cable. The high density of contacts allows use in applications with defined geometrical constraints, for instance in an end piece of a medical instrument with predefined dimensions. The modular terminal units also allow easy testing and if needed reworking for instance for easy validation testing outside of the terminal unit.

In addition to the terminal modules 10, 10', the connectors 2, 2' may advantageously further comprise electrical contacts 21, 21' suitable for electrical power supply, named herein power contacts 21, 21', positioned above and/or below the stack of modules. The power contacts are advantageously mounted in and supported directly by the housing 8, 8' of the terminal unit. The power contacts may advantageously comprise mating pin 21a' and receptacle 21a contact portions on respective connectors 2, 2'. The power contacts 21, 21' mounted directly in the housing 8, 8' of the terminal unit advantageously enable increased electrical power supply, without interfering with the stack arrangement of high density signal lines.

Referring to FIGS. 9a to 9f, in another embodiment, in addition to the terminal modules 10, 10', the terminal units 6, 6' of pluggable connectors may advantageously further comprise respective magnetically shielded contact units 49, 49' mounted in the respective terminal housings 8, 8' above and/or below the stack of terminal modules 10, 10', each contact unit comprising an insulating housing 52, 52' and one or a plurality of contacts 51, 51' mounted and supported in the housing to form units insertable in corresponding cavities 52, 52' of the terminal unit housings 8, 8'. The insertion of the magnetically shielded contact units 49, 49' in the terminal housings 8, 8' above (or below) the stack of terminal modules 10, 10' enables efficient use of the volume available between the flat terminal module and curved outer shape of the essentially cylindrical connector 2, 2'.

The insulating housings 52, 52' may advantageously have generally cylindrical shapes arranged for insertion in a cylindrical or essentially cylindrical magnetic shielding sheath 50 when the connectors 2, 2' are plugged together. The contacts may advantageously comprise mating receptacle 51 and pin 51' contact portions on respective connectors 2, 2'.

The shielding sheath 50 may advantageously comprise a Mu metal magnetic shield that wraps around both the male and female housings of the mating contact units pair. To achieve proper shield effectiveness, a length to diameter ratio of 3:1 minimum for the sheath may be provided. In an example of implementation, this may be done for instance by welding a thin sheet of MU metal (0.004-0.014") to form a tube of about 50 to 125 mm long with a diameter of about 13-20 mm.

This embodiment advantageously shields only those specific conductors that create stray magnetic fields inside of the connector, or that are sensitive to magnetic fields, while leaving the rest of the conductors unshielded, allow the connector system to be very compact while having high shielding effectiveness where needed. This is particularly useful for instance in medical applications, for instance in connecting catheters for instance for heart mapping that may be implemented in magnetic resonance imaging (MRI) environments subject to high magnetic fields.

---

List of references used (Female) Connector 2
  Casing 4
    Cable exit guide 28
    Cable exit end 29
    Plugging interface 30
    Inner shells 32
      Locking protuberance 39a
      Locking rib 41a
    Outer shell 34, 36
      Cable end locking ring 34
      Mating end locking ring 36
  Terminal unit 6
    Plugging interface 31
    Housing 8
      Casing positioning/locking elements 39a, 39b
      Module receiving cavity 37
        Sidewall 46
        Guide member 14a
          Latching member 16a
      Shielded contact unit receiving cavity 52
    Power contacts 21
      Receptacle contact 21a
    Magnetically shielded contact unit 49
      Insulating housing 52
      Contacts 51
    Terminal module 10
      Receptacle slot 11
      Contacts 18
        Contact rows 19a, 19b
        Plugging contact portion 38
        Connection portion 40
        Free end 43
      Terminal module housing 20
        First and second housing portions 20a, 20b, 20c, 20d
          Inner surface 45
          Outer surface 47
        Wiring board receiving cavity 42
      Magnetic shield 22
      Latching member 16b
      Guide member 14b
      Connection board 12
        Wire connection pads 24
        Contact pads 25
        Electrical/electronic components 26
        Locking recess 41b
Mating (Male) Connector 2'
  Casing 4'
    Plugging interface 30'
    Panel front locking ring 34'
    Panel rear locking ring 36'
  Terminal unit 6'
    Plugging interface 31'
    Housing 8'
      Module receiving cavity 37'
        Frontwall 47'
        Sidewall 46'
        Guide member 14a'
      Shielded contact unit receiving cavity 52'
    Power contacts 21'
      Pin contact 21a'
    Magnetically shielded contact unit 49'
      Insulating housing 52'
      Contacts 51'
    Terminal module 10', 10''
      Contacts 18'
      Connection board 13
        Contact pads 15
        Leading edge 17
        Wire connection pads 24
plugging direction A -continued List of references used outer diameter D
terminal module height H
terminal module width W

---

The invention claimed is:

1. High density pluggable electrical connector comprising a casing and a terminal unit mounted within the casing, the terminal unit comprising a housing with a module receiving cavity formed within the housing, and a plurality of terminal modules insertably received in the module receiving cavity in a stacked arrangement, each terminal module comprising a plurality of contacts mounted in a dielectric terminal module housing and a connection board connected to the contacts, wherein the connector comprises a number of electrical contacts exceeding sixty and a contact density on a plugging interface of the connector of at least forty contacts per square centimeter, said terminal module having a width W to height H ratio W/H greater than three, the contacts of each terminal module comprising, at a first end, spring plugging contact portions arranged in two rows forming a receptacle slot configured for receiving a male contact arrangement of a mating connector therein, the contacts of each terminal module further comprising, at a second end distal from the first end, connection portions connected to contact pads on the connection board, wherein the contact pads on the connection board are arranged at a leading edge of the connection board inserted between said connection portions of the contacts for electrical interconnection thereto.

2. Connector according to claim 1, wherein said terminal module comprises insertion guide members that cooperate with complementary guide members in the module receiving cavity of the housing to allow insertion of each terminal module in the housing at a defined level in the stack of the plurality of terminal modules.

3. Connector according to claim 2, wherein the guide member on the terminal module is in the form of an axially extending protuberance or bead received in a corresponding complementary axially extending recess or groove in a sidewall of the module receiving cavity.

4. Connector according to claim 2, wherein said terminal module comprises at least one locking element, on a lateral minor side of the terminal module housing that latches with at least one complementary latching member in the sidewall of the module receiving cavity.

5. Connector according to claim 2, wherein the guide members on the housing and terminal module are configured to allow the plurality of terminal modules to be inserted into the terminal housing in an axial direction (A) that corresponds to a plugging direction of the connector with a mating connector, and to be stacked one on top of each other.

6. Connector according to claim 1, wherein the connector comprises a number of electrical contacts exceeding one hundred and a contact density on a plugging interface of the connector of at least fifty contacts per square centimeter.

7. Connector according to claim 1, further comprising electrical contacts suitable for electrical power supply, positioned above and/or below the stack of modules and mounted directly in the housing of the terminal unit.

8. Connector according to claim 7, wherein said electrical contacts suitable for electrical power supply are receptacle contacts.

9. Connector according to claim 1, wherein at least one of the terminal modules comprises a magnetic shield surrounding the terminal module housing.

10. High density pluggable electrical connector comprising a casing and a terminal unit mounted within the casing, the terminal unit comprising a housing with a module receiving cavity formed within the housing, and a plurality of terminal modules insertably received in the module receiving cavity in a stacked arrangement, each terminal module comprising a plurality of contacts mounted in a dielectric terminal module housing and a connection board connected to the contacts, wherein the connector comprises a number of electrical contacts exceeding sixty and a contact density on a plugging interface of the connector of at least forty contacts per square centimeter, said terminal module having a width W to height H ratio W/H greater than three, the contacts of each terminal module comprising, at a first end, spring plugging contact portions arranged in two rows forming a receptacle slot configured for receiving a male contact arrangement of a mating connector therein, the contacts of each terminal module further comprising, at a second end distal from the first end, connection portions connected to contact pads on the connection board, wherein the connection board comprises wire connection pads arranged in at least two or more rows and at least five or more columns on both sides of the connection board.

11. Connector according to claim 10, wherein the connection board comprises said wire connection pads arranged in at least three or more rows and at least eight or more columns on both sides of the connection board.

12. Connector according to claim 10, wherein the connection board comprises electrical components for filtering signals or providing signal processing functions, connected to one or more electrical circuit traces interconnecting the contact pads to the wire connection pads.

13. High density pluggable electrical connector comprising a casing and a terminal unit mounted within the casing, the terminal unit comprising a housing with a module receiving cavity formed within the housing, and a plurality of terminal modules insertably received in the module receiving cavity in a stacked arrangement, each terminal module comprising a plurality of contacts mounted in a dielectric terminal module housing and a connection board connected to the contacts, wherein the connector comprises a number of electrical contacts exceeding sixty and a contact density on a plugging interface of the connector of at least forty contacts per square centimeter, said terminal module having a width W to height H ratio W/H greater than three, the contacts of each terminal module comprising, at a first end, spring plugging contact portions arranged in two rows forming a receptacle slot configured for receiving a male contact arrangement of a mating connector therein, the contacts of each terminal module further comprising, at a second end distal from the first end, connection portions connected to contact pads on the connection board, further comprising a magnetically shielded contact unit mounted in the terminal housing above and/or below the stack of terminal modules, the contact unit comprising a magnetic shielding sheath, an insulating housing insertable in the magnetic shielding sheath, and one or a plurality of contacts mounted and supported in said insulating housing, the magnetically shielded contact unit insertably mounted in a corresponding cavity of the terminal unit housing above and/or below the stack of terminal modules, wherein the magnetic shielding sheath has a generally cylindrical shape.

14. Connector according to claim 13, wherein the magnetic shielding sheath has a length to diameter ratio of at least three.

15. High density pluggable electrical connector system comprising:
a high density pluggable electrical connector comprising a casing and a terminal unit mounted within the casing, the terminal unit comprising a housing with a module receiving cavity formed within the housing, and a plurality of terminal modules insertably received in the module receiving cavity in a stacked arrangement, each terminal module comprising a plurality of contacts mounted in a dielectric terminal module housing and a connection board connected to the contacts, wherein the connector comprises a number of electrical contacts exceeding sixty and a contact density on a plugging interface of the connector of at least forty contacts per square centimeter, said terminal module having a width W to height H ratio W/H greater than three, the contacts of each terminal module comprising, at a first end, spring plugging contact portions arranged in two rows forming a receptacle slot configured for receiving a male contact arrangement of a mating connector therein, the contacts of each terminal module further comprising, at a second end distal from the first end, connection portions connected to contact pads on the connection board; and
a mating connector pluggably connectable and disconnectable thereto, the mating connector comprising a housing and a plurality of terminal modules mounted in a stacked arrangement in said housing, each terminal module comprising a connection board comprising a plurality of contact pads arranged in a juxtaposed manner along a leading edge of the connection board for pluggable connection to a corresponding said plurality of contacts of said connector, wherein the connection board of the mating connector comprises wire connection pads arranged in at least two or more rows and at least five or more columns on both sides of the connection board.

16. Connector system according to claim 15, wherein the mating connector comprises a casing and a terminal unit mounted within the casing, the terminal unit comprising said housing with a module receiving cavity formed within the housing, said plurality of terminal modules insertably received in the module receiving cavity.

17. Connector system according to claim 16, wherein each terminal module of the mating connector consists of one connection board.

18. Connector system according to claim 15, wherein said wire connection pads of the mating connector are arranged in at least three or more rows and at least eight or more columns on both sides of the connection board.

19. Connector system according to claim 15, wherein said mating connector further comprises electrical contacts suitable for electrical power supply, positioned above and/or below the stack of modules and mounted directly in the housing of the terminal unit of the mating connector.

20. Connector according to claim 19, wherein said electrical contacts suitable for electrical power supply of the mating connector are pin contacts.

21. Connector system according to claim 15, wherein said mating connector further comprises a contact unit mounted in the terminal housing above and/or below the stack of terminal modules, the contact unit comprising an insulating housing insertable in a magnetic shielding sheath, and one or a plurality of contacts mounted and supported in said insulating housing, the contact unit insertably mounted in a corresponding cavity of the terminal unit housing above and/or below the stack of terminal modules.

\* \* \* \* \*